(12) United States Patent
Kimura

(10) Patent No.: US 7,489,160 B2
(45) Date of Patent: Feb. 10, 2009

(54) SEMICONDUCTOR DEVICE CAPABLE OF ADJUSTING OUTPUT IMPEDANCE OF EXTERNAL SEMICONDUCTOR DEVICE AND OUTPUT IMPEDANCE ADJUSTING METHOD

(75) Inventor: Koji Kimura, Kanagawa (JP)

(73) Assignee: NEC Electronics Corporation, Kawasaki, Kanagawa (JP)

(*) Notice: Subject to any disclaimer, the term of this patent is extended or adjusted under 35 U.S.C. 154(b) by 0 days.

(21) Appl. No.: 11/812,751

(22) Filed: Jun. 21, 2007

(65) Prior Publication Data
US 2008/0007289 A1    Jan. 10, 2008

(30) Foreign Application Priority Data
Jun. 22, 2006    (JP)    ............... 2006-172375

(51) Int. Cl.
    *H03K 17/16* (2006.01)
(52) U.S. Cl. .......................................... 326/30; 326/86
(58) Field of Classification Search ............... 326/21, 326/26, 30, 81–83, 86–87; 327/108–109, 327/112, 50–52
    See application file for complete search history.

(56) References Cited
U.S. PATENT DOCUMENTS
6,414,525 B2 *    7/2002    Urakawa .................... 327/112

| 6,605,958 | B2 * | 8/2003 | Bergman et al. | 326/30 |
| 6,639,423 | B2 * | 10/2003 | Martin et al. | 326/30 |
| 6,980,020 | B2 * | 12/2005 | Best et al. | 326/30 |
| 7,054,771 | B2 * | 5/2006 | Batra et al. | 702/64 |
| 2007/0290712 | A1 * | 12/2007 | Gomez et al. | 326/30 |

FOREIGN PATENT DOCUMENTS
JP    11-17518    1/1999

OTHER PUBLICATIONS
JEDEC Solid State Technoloty Association, "JEDEC Standard DDR2 SDRAM Specification" JESD79-2A, Jan. 2004.

* cited by examiner

*Primary Examiner*—Don P Le
*Assistant Examiner*—Christopher Lo
(74) *Attorney, Agent, or Firm*—McGinn IP Law Group, PLLC

(57) ABSTRACT

In a semiconductor device capable of adjusting an output impedance of a first output impedance adjustable output buffer of an external semiconductor device connectable to the semiconductor device, a second output impedance adjustable output buffer is provided. A comparator compares a first output voltage of a real load circuit including the first output impedance adjustable output buffer with a second output voltage of a replica load circuit including the second output impedance adjustable output buffer. An output impedance control circuit transmits an output signal of the comparator to the external semiconductor device to adjust the output impedance of the first output impedance adjustable output buffer, so that the first output voltage is made equal to the second output voltage.

16 Claims, 11 Drawing Sheets

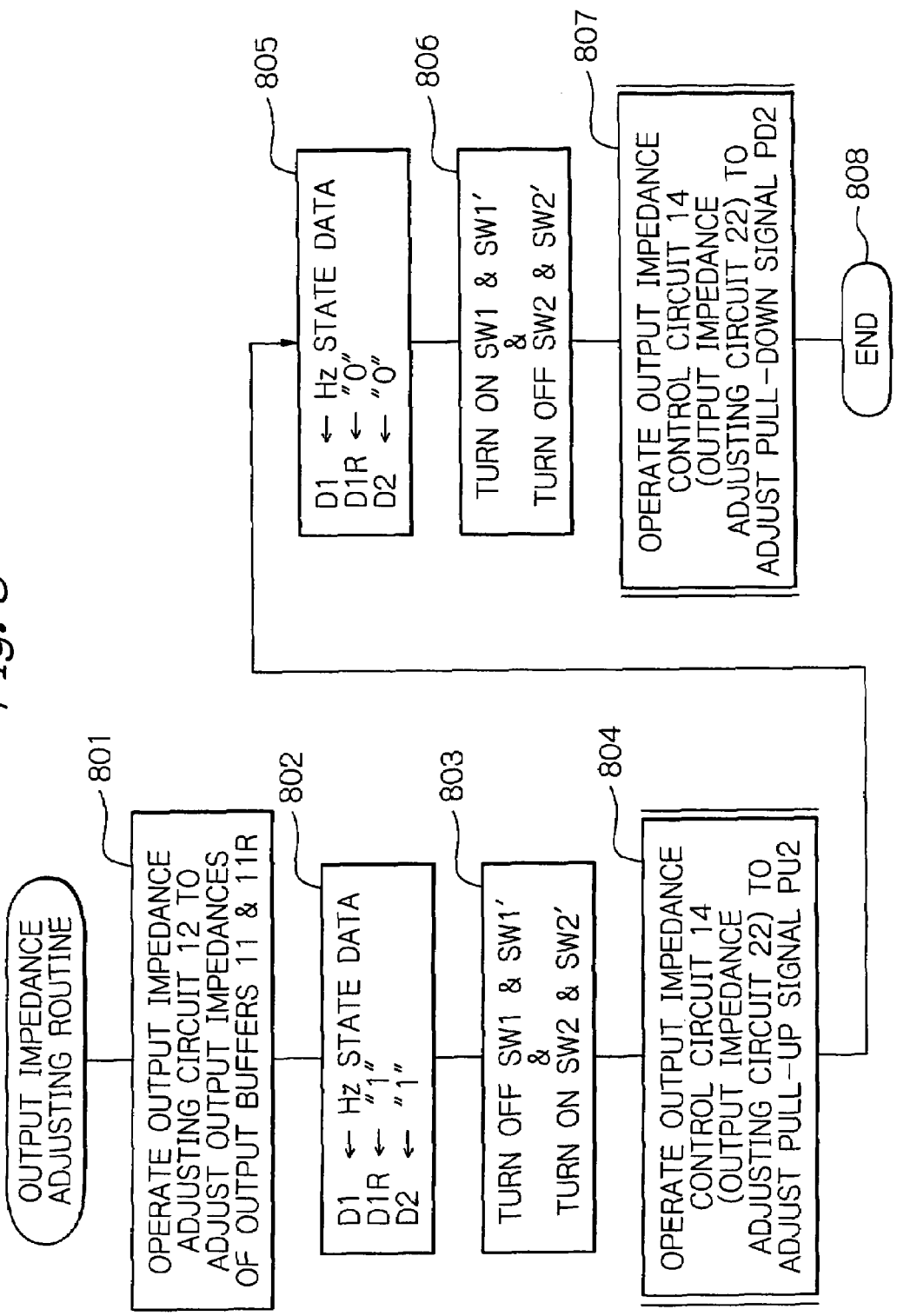

SEMICONDUCTOR DEVICE CAPABLE OF ADJUSTING OUTPUT IMPEDANCE OF EXTERNAL SEMICONDUCTOR DEVICE AND OUTPUT IMPEDANCE ADJUSTING METHOD

BACKGROUND OF THE INVENTION

1. Field of the Invention

The present invention relates to a semiconductor device capable of adjusting an output impedance of an output impedance adjustable output buffer of an external semiconductor device connectable to the semiconductor device, and an output impedance adjusting method.

2. Description of the Related Art

Semiconductor devices (chips) such as a double data rate 2 synchronous dynamic random access memory (DDR2 SDRAM) have no output impedance adjusting function therein. In such semiconductor devices, an off-chip driver impedance (OCD) adjusting function is incorporated thereinto, so that the output impedances of the semiconductor devices are adjusted by another semiconductor device (chip) such as a direct memory access (DMA) controller. Regarding the OCD impedance adjustment, refer to JEDEC Solid State Technology Association, "JEDEC Standard DDR2 SDRAM SPECIFICATION", JESD79-2A, January 2004.

In a first prior art semiconductor apparatus where a semiconductor device such as a DMA controller including an output impedance adjustable output buffer adjusts the output impedance of an output impedance adjustable output buffer of an external semiconductor device such as a DDR2 SDRAM connected by a transmission line to the DMA controller, first, the output impedance of an output impedance adjustable output buffer of the DMA controller is adjusted. Then, one of the output impedance adjustable output buffers is controlled to generate a high level signal and the other is controlled to generate a low level signal, so that a current path is established from a power supply terminal through the two output impedance adjustable output buffers to a ground terminal. In this state, a comparator compares an input voltage, i.e., the output voltage of the output impedance adjustable output buffer of the DMA controller with a definite reference voltage such as $V_{DD}/2$ where $V_{DD}$ is the power supply voltage. An output impedance control circuit transmits an output signal of the comparator to the DDR2 SDRAM to adjust the output impedance of the output impedance adjustable output buffer of the DDR2 SDRAM, so that the input voltage is made equal to $V_{DD}/2$. This will be explained later in detail.

In a second prior art semiconductor apparatus where a semiconductor device such as a DMA controller including two output impedance adjustable differential output buffers adjusts the output impedances of two output impedance adjustable differential output buffers of an external semiconductor device such as a DDR2 SDRAM connected by transmission lines to the DMA controller, first, the output impedance adjustable differential output buffers of the DMA controller are controlled to be in a high impedance (Hz) state. Then, one of the output impedance adjustable differential output buffers of the DDR2 SDRAM is controlled to generate a high level signal and the other is controlled to generate a low level signal, so that a current path is established from a power supply terminal through the two output impedance adjustable differential output buffers via a turned-ON switch to a ground terminal. In this state, a comparator compares an input voltage, i.e., the center output voltage of the output impedance adjustable differential output buffers of the DDR2 SDRAM with a definite reference voltage such as $V_{DD}/2$ where $V_{DD}$ is the power supply voltage. An output impedance control circuit transmits an output signal of the comparator to the DDR2 SDRAM to adjust the output impedance of the output impedance adjustable output buffer of the DDR2 SDRAM, so that the input voltage is made equal to $V_{DD}/2$. This will be explained later in detail.

SUMMARY OF THE INVENTION

In the above-described first prior art semiconductor apparatus, however, if a series resistor (dumping resistor) is inserted into the transmission line, the expected voltage of the output impedance adjustable output buffer of the DMA controller is deviated from $V_{DD}/2$, i.e., the reference voltage is deviated from $V_{DD}/2$. As a result, the DMA controller has to be designed to respond to the value of the above-mentioned inserted series resistor, which would diminish the general-purpose property, i.e., increase the manufacturing cost.

Also, in the above-described first prior art semiconductor apparatus, in an impedance adjusting operation for the output impedance adjustable output buffer of the DDR2 SDRAM, the above-mentioned current path is realized within the output impedance adjustable output buffers, so that the adjustment error of the output impedance of the output impedance adjustable output buffer of the DDR2 SDRAM is remarkably large. That is, as will be later discussed, a current flowing through the above-mentioned current path is very large, so that the reduction in voltage by a parasitic resistance of signal lines including the transmission line is very large. This would invite a large error in the adjusted output impedance.

On the other hand, in the above-described second prior art semiconductor apparatus, however, since the absolute value of the output impedance of each of the output impedance adjustable differential output buffers cannot be recognized, this absolute value cannot be adjusted. This is fatal in a DDR2 SDRAM where an access is carried out by using both rising edges and falling edges of a clock signal.

Also, in the above-described second prior art semiconductor apparatus, in an impedance adjusting operation for the output impedance adjustable differential output buffers, the above-mentioned current path is realized within the output impedance adjustable differential output buffers, so that the adjustment error of the output impedances of the output impedance adjustable differential output buffers is remarkably large. That is, as will be explained later, a current flowing through the above-mentioned current path is very large, so that the reduction in voltage by parasitic resistance of signal lines including the transmission lines is very large. This would invite a large error in the adjusted output impedance.

According to the present invention, in a semiconductor device capable of adjusting an output impedance of a first output impedance adjustable output buffer of an external semiconductor device connectable to the semiconductor device, a second output impedance adjustable output buffer is provided. A comparator compares a first output voltage of a real load circuit including the first output impedance adjustable output buffer with a second output voltage of a replica load circuit including the second output impedance adjustable output buffer. An output impedance control circuit transmits an output signal of the comparator to the external semiconductor device to adjust the output impedance of the first output impedance adjustable output buffer, so that the first output voltage is made equal to the second output voltage.

Also, a first pull-up/pull-down circuit is connected to a first input of the comparator, and a second pull-up/pull-down circuit is connected to a second input of the comparator.

Further, an external replica resistor whose resistance value corresponds to a characteristic impedance of a transmission line connected between the first input of the comparator and the first output impedance adjustable output buffer is provided. The external replica resistor can be easily replaced with another external resistor. On the other hand, the external replica resistor is replaced by internal replica resistors and internal switches for selecting the internal replica resistors, so that various resistances can be selected.

BRIEF DESCRIPTION OF THE DRAWINGS

The present invention will be more clearly understood from the description set forth below, as compared with the prior art, with reference to the accompanying drawings, wherein:

FIG. 8 is a flowchart for explaining the output impedance adjusting operation of the semiconductor apparatus of FIG. 7;

DESCRIPTION OF THE PREFERRED EMBODIMENT

Before the description of the preferred embodiment, prior art semiconductor apparatuses will be explained with reference to FIGS. 1, 2, 3, 4, 5 and 6.

Figure 1:
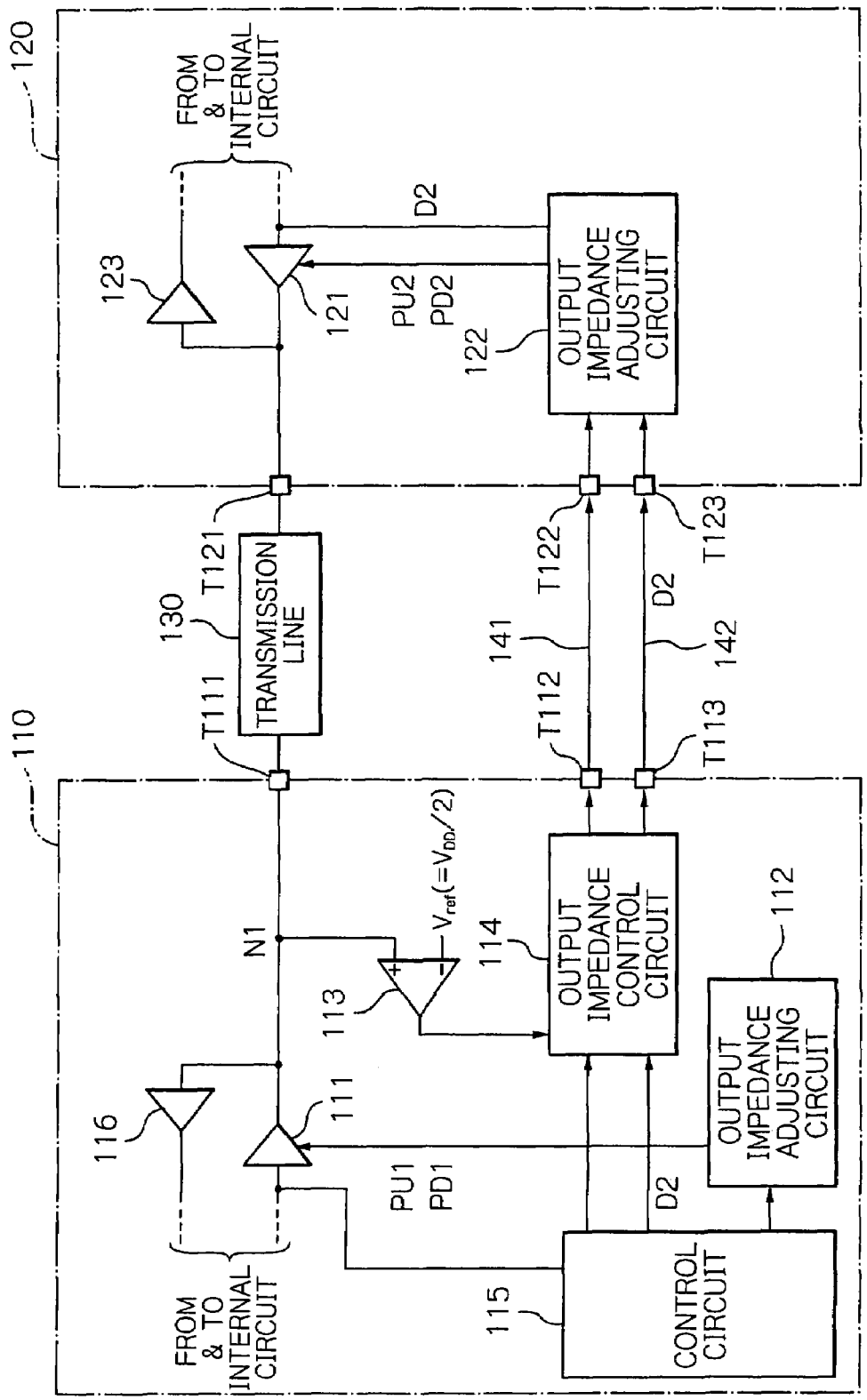
FIG. 1 is a circuit diagram illustrating a first prior art semiconductor apparatus.

In FIG. 1, which illustrates a first prior art semiconductor apparatus, reference numeral 110 designates a semiconductor device (chip) such as a DMA controller, and 120 designates a semiconductor device (chip) such as a DDR2 SDRAM. In this case, the output impedance of the semiconductor device 110 is controlled by the semiconductor device 110 per se, while the output impedance of the semiconductor device 120 is controlled by the semiconductor device 110, not the semiconductor device 120.

The semiconductor device 110 is constructed by an output impedance adjustable output buffer 111 connected to an input/output terminal T111, an output impedance adjusting circuit 112 for adjusting the output impedance of the output impedance adjustable output buffer 111, a comparator 113 for comparing the voltage at a node N1 connected to the input/output terminal T111 with a reference voltage $V_{ref}(=V_{DD}/2)$, an output impedance controlling circuit 114 for controlling the output impedance of the semiconductor device 120 in accordance with the output signal of the comparator 113, and a control circuit 115 for controlling the output impedance adjusting circuit 112 and the output impedance controlling circuit 114.

Note that an input buffer 116 is also connected to the node N1. Also, the output impedance controlling circuit 114 is connected to input/output terminals T112 and T113. Further, the output impedance adjustable output buffer 111 and the input buffer 116 are connected to an internal circuit (not shown).

On the other hand, the semiconductor device 120 is constructed by an output impedance adjustable output buffer 121 connected to an input/output terminal T121 and an output impedance adjusting circuit 122 for adjusting the output impedance of the output impedance adjustable output buffer 121.

Note that an input buffer 123 is also connected to the input/output terminal T121. Also, the output impedance adjusting circuit 122 is connected to input/output terminals T122 and T123. Further, the output impedance adjustable output buffer 121 and the input buffer 123 are connected to an internal circuit (not shown).

The input/output terminal T111 of the semiconductor device 110 is connected by a transmission line 130 to the input/output terminal T121 of the semiconductor device 120. Also, the input/output terminals T112 and T113 of the semiconductor device 110 are connected by external connections 141 and 142 to the input/output terminals T122 and T123, respectively, of the semiconductor device 120.

The control circuit 115 operates the output impedance adjusting circuit 112, so that the output impedance adjusting circuit 112 generates a pull-up adjusting signal PU1 formed of m bits and a pull-down adjusting signal PD1 formed of m bits which are supplied to the output impedance adjustable output buffer 111, thus adjusting the output impedance of the output impedance adjustable output buffer 111. That is, the output impedance of the output impedance adjustable output buffer 111 is adjusted by the semiconductor device 110 per se.

Note that the control circuit 115 also generates a data signal D1 which is supplied to the output impedance adjustable output buffer 111.

On the other hand, the control circuit 115 operates the output impedance control circuit 114 which, in turn, operates the output impedance adjusting circuit 122, so that the output impedance adjusting circuit 122 generates a pull-up adjusting signal PU2 formed by m bits and a pull-down adjusting signal PD2 formed by m bits which are supplied to the output impedance adjustable output buffer 121, thus adjusting the output impedance of the output impedance adjustable output buffer 121. That is, the output impedance of the output impedance adjustable output buffer 121 is adjusted by the semiconductor device 110, not the semiconductor device 120.

Note that the output impedance adjusting circuit 122 also generates a data signal D2 which is supplied to the output impedance adjustable output buffer 121.

Figure 2:
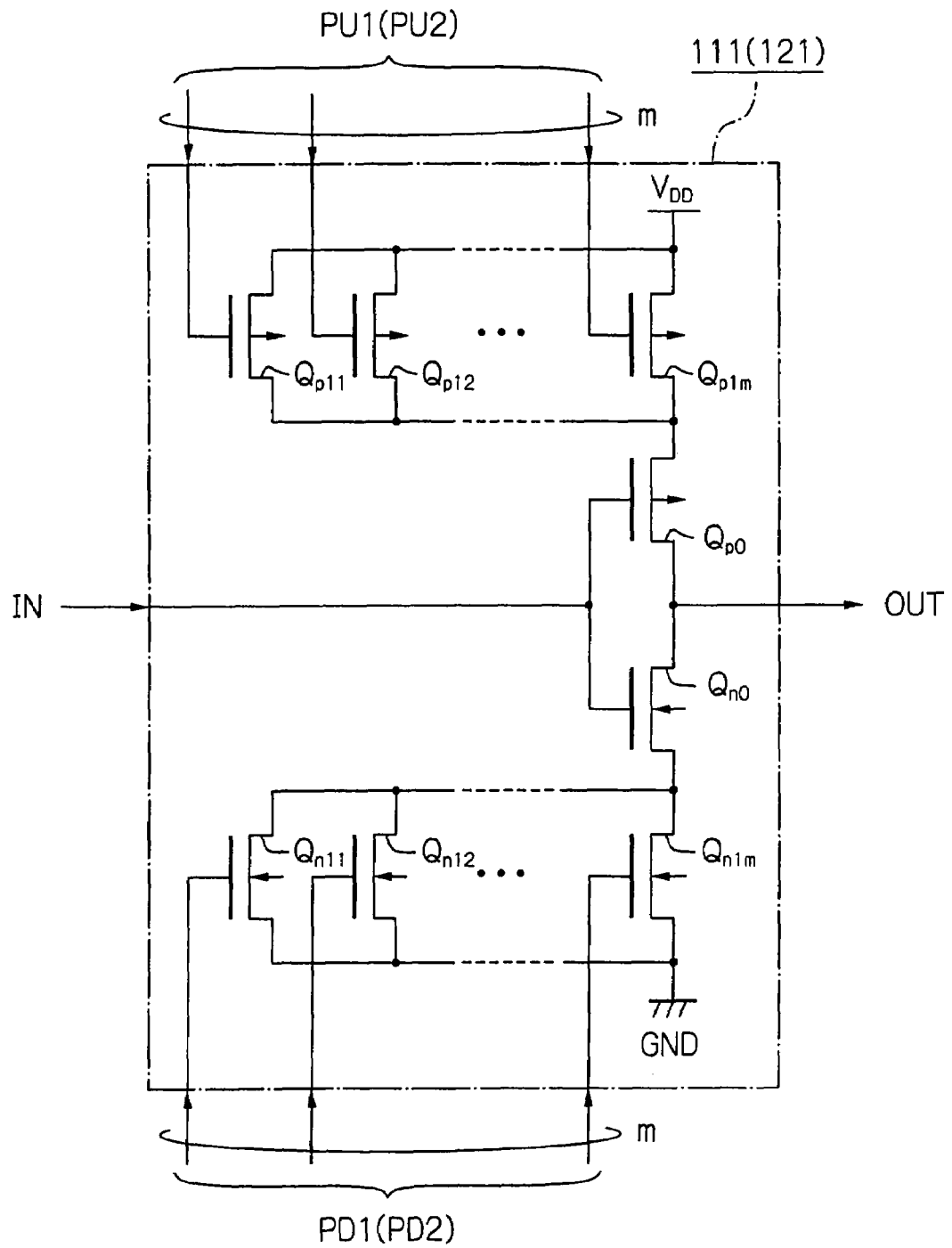
FIG. 2 is a circuit diagram of the output impedance adjustable output buffer of FIG. 1.
Figure 3:
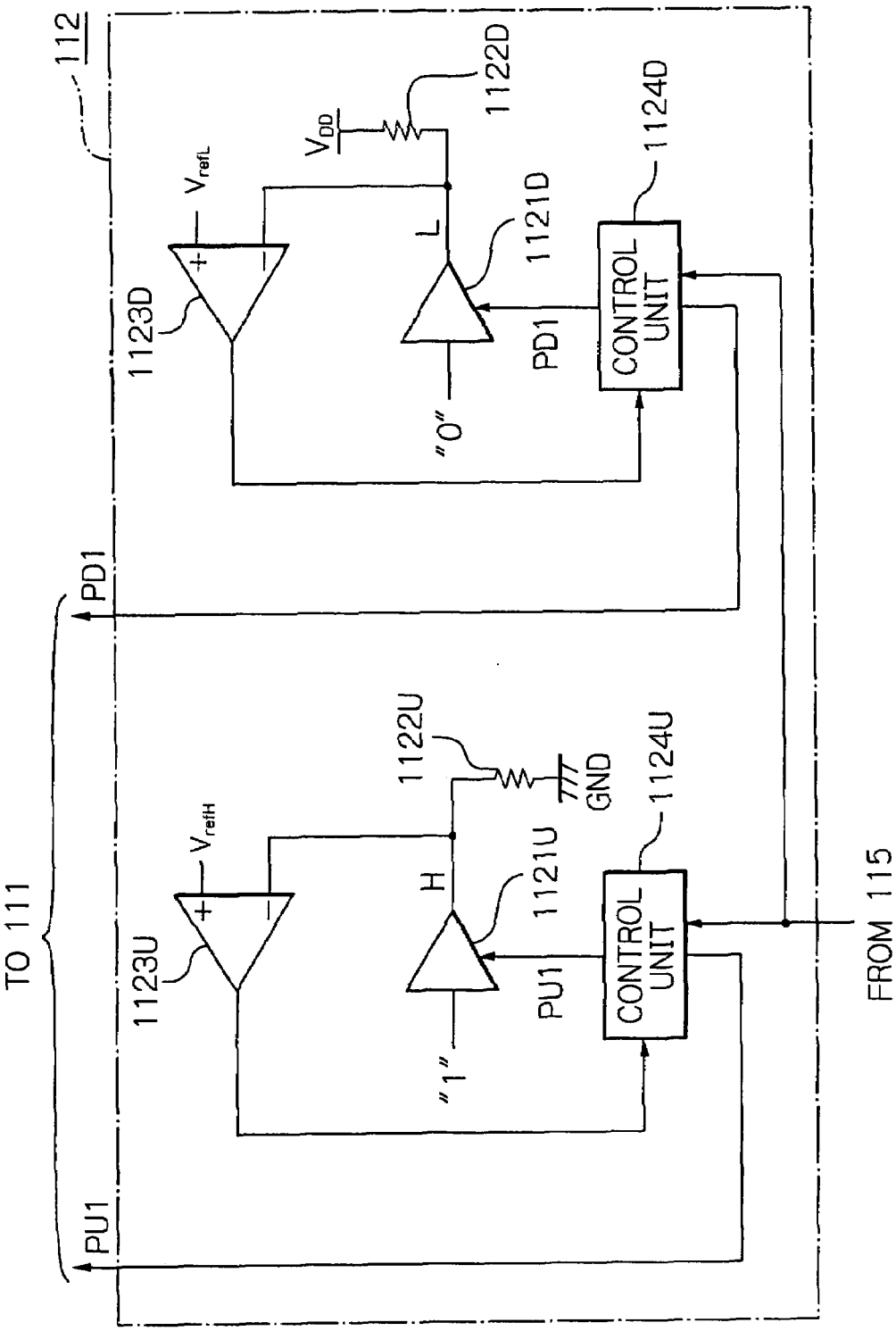
FIG. 3 is a circuit diagram of the output impedance adjusting circuit of the controlling side semiconductor device of FIG. 1.

In FIG. 2, which is a detailed circuit diagram of the output impedance adjustable output buffer 111 (121) of FIG. 1 (see: FIG. 3 of JP-11-17518 A), the output buffer 111 (121) is constructed by a p-channel MOS transistor $Q_{p0}$ and an n-channel MOS transistor $Q_{n0}$ where the gates receive an input signal IN and the drains generate an output signal OUT. Also, a plurality of p-channel MOS transistors $Q_{p11}$, $Q_{p12}$, ..., $Q_{p1m}$ whose gates are controlled by the pull-up adjusting signal PU1 (PU2) are connected between a power supply terminal $V_{DD}$ and the source of the p-channel MOS transistor $Q_{p0}$, and a plurality of n-channel MOS transistors $Q_{n11}, Q_{n12}, \ldots, Q_{n1m}$ whose gates are controlled by the pull-down adjusting signal PD1 (PD2), are connected between a ground terminal GND and the source of the n-channel MOS transistor $Q_{n0}$.

Thus, the number of the ON-state p-channel MOS transistors $Q_{p11}, Q_{p12}, \ldots, Q_{p1m}$ and the number of the ON-state n-channel MOS transistors $Q_{n11}, Q_{n12}, \ldots, Q_{n1m}$ are controlled by the pull-up adjusting signal PU1 (PU2) and the pull-down adjusting signal PD1 (PD2) to adjust the output impedance of the output impedance adjustable output buffer 111 (121).

In FIG. 3, which is a detailed circuit diagram of the output impedance adjusting circuit 112 of FIG. 1, the output impedance adjusting circuit 112 is constructed by a replica output impedance adjustable output buffer 1121U of the output impedance adjustable output buffer 111, a resistor 1122U connected between the output of the replica output impedance adjustable output buffer 1121U and the ground terminal GND, a comparator 1123U for comparing the output voltage of the replica output impedance adjustable output buffer 1121U with a reference voltage $V_{refH}$, and a control unit 1124U for adjusting the pull-up adjusting signal PU1 in accordance with the output voltage of the comparator 1123U. In this case, a data signal "1" is supplied to the replica output impedance adjustable output buffer 1121U which, in turn, generates a high level signal H. Therefore, the control unit 1124U adjusts the pull-up adjusting signal PU1 so that the output voltage of the replica output impedance adjustable output buffer 1121U is made equal to the reference voltage $V_{refH}$. Then, the adjusted pull-up adjusting signal PU1 is supplied to the output impedance adjustable output buffer 111. Also, the output impedance adjusting circuit 112 is constructed by a replica output impedance adjustable output buffer 1121D of the output impedance adjustable output buffer 111, a resistor 1122D connected between the output of the replica output impedance adjustable output buffer 1121D and the power supply terminal $V_{DD}$, a comparator 1123D for comparing the output voltage of the replica output impedance adjustable output buffer 1121D with a reference voltage $V_{refL}$, and a control unit 1124D for adjusting the pull-down adjusting signal PD1 in accordance with the output voltage of the comparator 1123D. In this case, a data signal "0" is supplied to the replica output impedance adjustable output buffer 1121D which, in turn, generates a low level signal L. Therefore, the control unit 1124D adjusts the pull-down adjusting signal PD1 so that the output voltage of the replica output impedance adjustable output buffer 1121D is made equal to the reference voltage $V_{refL}$. Then, the adjusted pull-down adjusting signal PD1 is supplied to the output impedance adjustable output buffer 111.

Note that the control units 1124U and 1124D are operated by the control circuit 115. Also, the resistance value of each of the resistors 1123U and 1123D corresponds to the characteristic impedance of the transmission line 130 of FIG. 1.

The output impedance adjusting operation of the semiconductor apparatus of FIG. 1 is explained next.

First, the control circuit 115 operates the output impedance adjusting circuit 112, so that the output impedance of the output impedance adjustable output buffer 111 is adjusted. That is, the control units 1124U and 1124D of FIG. 2 are operated to determine the pull-up adjusting signal PU1 and the pull-down adjusting signal PD1 which are then transmitted to the output impedance adjustable output buffer 111.

Next, the control circuit 115 generates a data signal D1 whose value is "0". The data signal D1 is transmitted to the output impedance adjustable output buffer 111 which, in turn, generates a low signal L.

Next, the control circuit 115 generates a data signal D2 whose value is "1". The data signal D2 is transmitted to the output impedance control circuit 114 which, in turn, transmits the data signal D2 via the external connection 142 to the output impedance adjusting circuit 122. Then, the output impedance adjusting circuit 122 transmits the data signal D2 to the output impedance adjustable output buffer 121 which, in turn, generates a high signal H.

Thus, a current path is established from the power supply terminal $V_{DD}$ through the output impedance adjustable output buffer 121, the input/output terminal T121, the transmission line 130, the input/output terminal T111, the node N1 and the output impedance adjustable output buffer 111 to the ground terminal GND. In this case, if the resistance of the transmission line 130 is negligible, the voltage at the node N1 is expected to be $V_{DD}/2$.

Next, the output impedance control circuit 114 transmits the output signal of the comparator 113 via the external connection 141 to the output impedance adjusting circuit 122 which adjusts the pull-up adjusting signal PU2, so that the voltage at the node N1 is made equal to $V_{DD}/2$. As a result, the pull-up adjusting signal PU2 is determined.

Next, the control circuit 115 generates a data signal D1 whose value is "1". The data signal D1 is transmitted to the output impedance adjustable output buffer 111 which, in turn, generates a high signal H.

Next, the control circuit 115 generates a data signal D2 whose value is "0". The data signal D2 is transmitted to the output impedance control circuit 114 which, in turn, transmits the data signal D2 via the external connection 142 to the output impedance adjusting circuit 122. Then, the output impedance adjusting circuit 122 transmits the data signal D2 to the output impedance adjustable output buffer 121 which, in turn, generates a low signal L.

Thus, a current path is established from the power supply terminal $V_{DD}$ through the output impedance adjustable output buffer 111, the node N1, the input/output terminal T111, the transmission line 130, the input/output terminal T121 and the output impedance adjustable output buffer 121 to the ground terminal GND. In this case, if the resistance of the transmission line 130 is negligible, the voltage at the node N1 is expected to be $V_{DD}/2$.

Next, the output impedance control circuit 114 transmits the output signal of the comparator 113 via the external connection 141 to the output impedance adjusting circuit 122 which adjusts the pull-down adjusting signal PD2, so that the voltage at the node N1 is made equal to $V_{DD}/2$. As a result, the pull-down adjusting signal PD2 is determined.

Thus, the adjustment of the output impedance of the output impedance adjustable output buffer 121 is completed.

In the semiconductor apparatus of FIG. 1, however, if a series resistor (dumping resistor) is inserted into the transmission line 130, the expected voltage at the node N1 is deviated from $V_{DD}/2$, i.e., the reference voltage $V_{ref}$ is deviated from $V_{DD}/2$. As a result, the semiconductor device 110 has to be designed to respond to the value of the above-mentioned inserted series resistor, which would diminish the general-purpose property, i.e., increase the manufacturing cost.

Also, in the semiconductor apparatus of FIG. 1, in an impedance adjusting operation for the output impedance adjustable output buffer 121, the above-mentioned current path is realized within the output impedance adjustable output buffers 111 and 121, so that the adjustment error of the output impedance of the output impedance adjustable output buffer 121 is remarkably large. That is, if the semiconductor device 120 is a DDR2 SDRAM, the source-to-drain voltage $V_{DS}$ of each of the transistors $Q_{P0}$, and $Q_{n0}$ (see: FIG. 2) is 280 mV and the source-to-drain resistance of each of the transistors $Q_{P0}$ and $Q_{n0}$ (see: FIG. 2) is 15 to 20 Ω. Note that the source-to-drain voltage and resistance of each of the transistors of the output impedance adjustable output buffer 111 of the semiconductor device 110 have equivalent values corresponding to those of the semiconductor device 120. Therefore, a current flowing through the above-mentioned current path is very large, i.e., 22 to 45 mA, so that the reduction in voltage by a parasitic resistance of signal lines including the transmission line 130 is very large. This would invite a large error in the adjusted output impedance.

Figure 4:
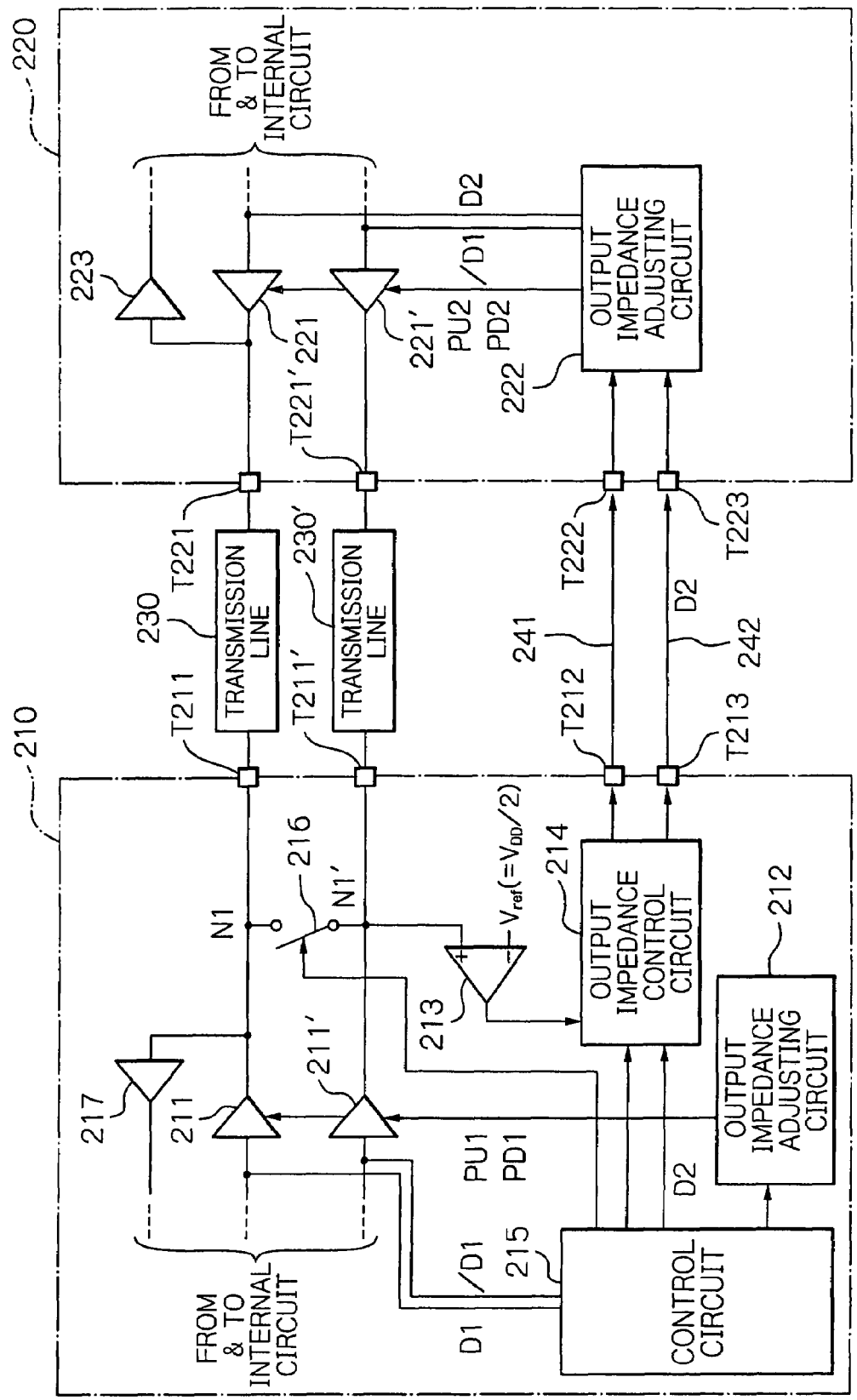
FIG. 4 is a circuit diagram illustrating a second prior art semiconductor apparatus.

In FIG. 4, which illustrates a second prior art semiconductor apparatus, reference numeral 210 designates a semiconductor device (chip) such as a DMA controller, and 220 designates a semiconductor device (chip) such as a DDR2 SDRAM. In this case, the output impedance of the semiconductor device 210 is controlled by the semiconductor device 210 per se, while the output impedance of the semiconductor device 220 is controlled by the semiconductor device 210, not the semiconductor device 220.

The semiconductor device 210 is constructed by output impedance adjustable differential output buffers 211 and 211' connected to input/output terminals T211 and T211', respectively, an output impedance adjusting circuit 212 for adjusting the output impedances of the output impedance adjustable differential output buffers 211 and 211', a comparator 213 for comparing the voltage at a node N1 (N1') connected to the input/output terminal T211 (T211') with a reference voltage $V_{ref}(=V_{DD}/2)$, an output impedance controlling circuit 214 for controlling the output impedance of the semiconductor device 220 in accordance with the output signal of the comparator 213, and a control circuit 215 for controlling the output impedance adjusting circuit 212 and the output impedance controlling circuit 214.

Also, a switch 216 is provided for connecting the node N1 to the node N1'. This switch 216 is controlled by the control circuit 215.

Note that an input buffer 217 is also connected to the nodes N1 and N1'. Also, the output impedance controlling circuit 214 is connected to input/output terminals T212 and T213. Further, the output impedance adjustable differential output buffers 211 and 211' and the input buffer 217 are connected to an internal circuit (not shown).

On the other hand, the semiconductor device 220 is constructed by output impedance adjustable differential output buffers 221 and 221' connected to input/output terminals T221 and T221', respectively, and an output impedance adjusting circuit 222 for adjusting the output impedance of the output impedance adjustable differential output buffers 221 and 221'.

Note that an input buffer 223 is also connected to the input/output terminals T221 and T221'. Also, the output impedance adjusting circuit 222 is connected to input/output terminals T222 and T223. Further, the output impedance adjustable differential output buffer 221 and 221' and the input buffer 223 are connected to an internal circuit (not shown).

The input/output terminals T211 and T211' of the semiconductor device 210 are connected by transmission lines 230 and 230' to the input/output terminals T221 and T221', respectively, of the semiconductor device 220. Also, the input/output terminals T212 and T213 of the semiconductor device 210 are connected by external connections 241 and 242 to the input/output terminals T222 and T223, respectively, of the semiconductor device 220.

The control circuit 215 operates the output impedance adjusting circuit 212, so that the output impedance adjusting circuit 212 generates a pull-up adjusting signal PU1 formed of m bits and a pull-down adjusting signal PD1 formed of m bits which are supplied to the output impedance adjustable differential output buffers 211, thus adjusting the output impedances of the output impedance adjustable differential output buffers 211 and 211'. That is, the output impedances of the output impedance adjustable differential output buffers 211 and 211' are adjusted by the semiconductor device 210 per se.

Note that the control circuit 215 also generates data signals D1 and /D1 which are supplied to the output impedance adjustable differential output buffers 211 and 211', respectively.

On the other hand, the control circuit 215 operates the output impedance control circuit 214 which, in turn, operates the output impedance adjusting circuit 222, so that the output impedance adjusting circuit 222 generates a pull-up adjusting signal PU2 formed by m bits and a pull-down adjusting signal PD2 formed by m bits which are supplied to the output impedance adjustable differential output buffers 221 and 221', thus adjusting the output impedances of the output impedance adjustable differential output buffers 221 and 221'. That is, the output impedances of the output impedance adjustable differential output buffers 221 and 221' are adjusted by the semiconductor device 210, not the semiconductor device 220.

Note that the output impedance adjusting circuit 222 also generates data signals D2 and /D2 which are supplied to the output impedance adjustable differential output buffers 221 and 221', respectively.

Figure 5:
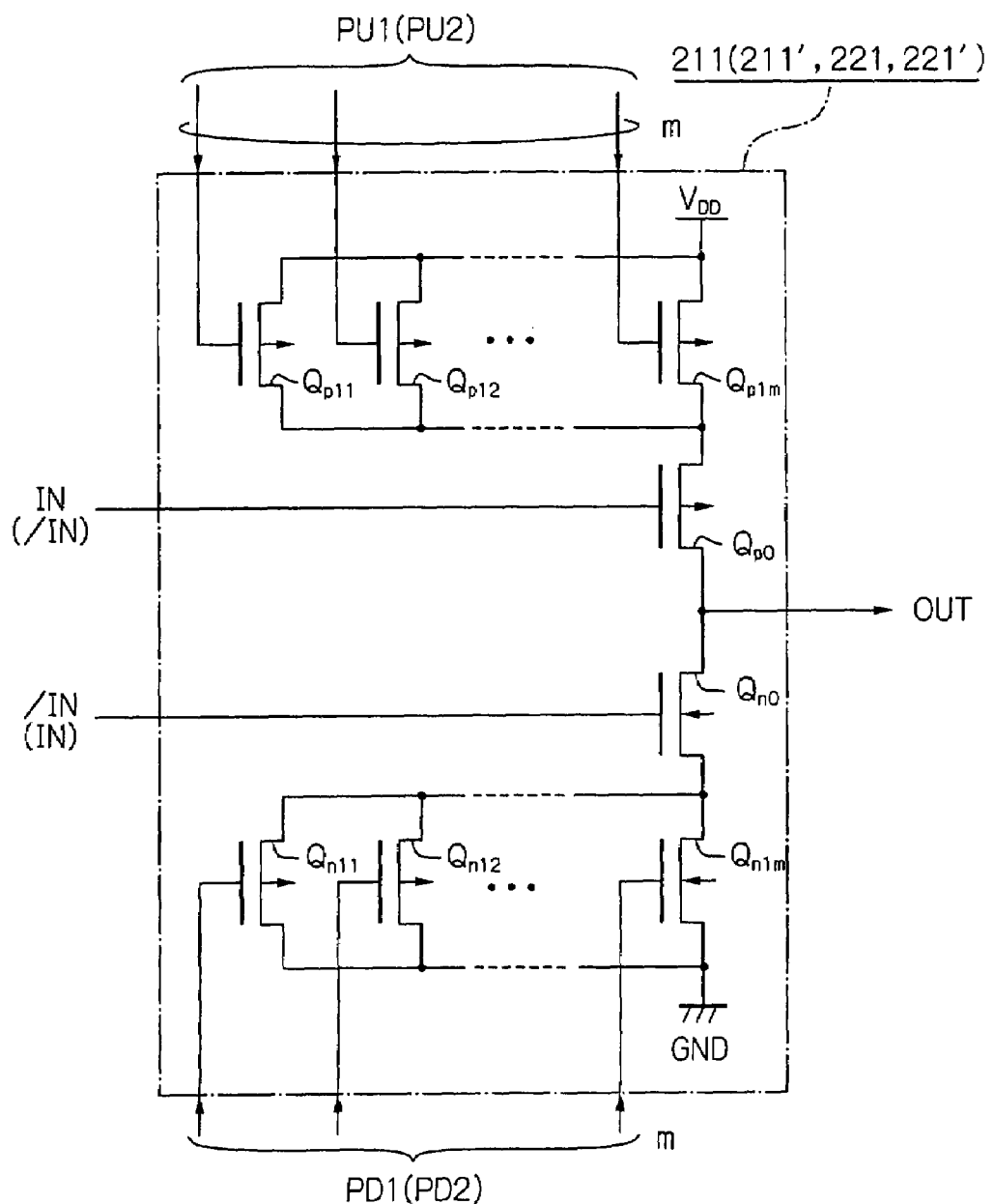
FIG. 5 is a circuit diagram of one of the output impedance adjustable differential output buffers of FIG. 4.

In FIG. 5, which is a detailed circuit diagram of the output impedance adjustable differential output buffer 211 (211', 221, 221') of FIG. 4, the output buffer 211 (211', 221, 221') has the same circuit configuration as that of FIG. 2, except that the gate of the p-channel MOS transistor $Q_{p0}$ receives an input signal IN (/IN) and the gate of the n-channel MOS transistor $Q_{n0}$ receives its inverted signal /IN (IN). Therefore, when the input signal IN (/IN) is high and the input signal /IN (IN) is low, the output impedance adjustable differential output buffer 211 (211', 221, 221') is in a high impedance (Hz) state.

Figure 6:
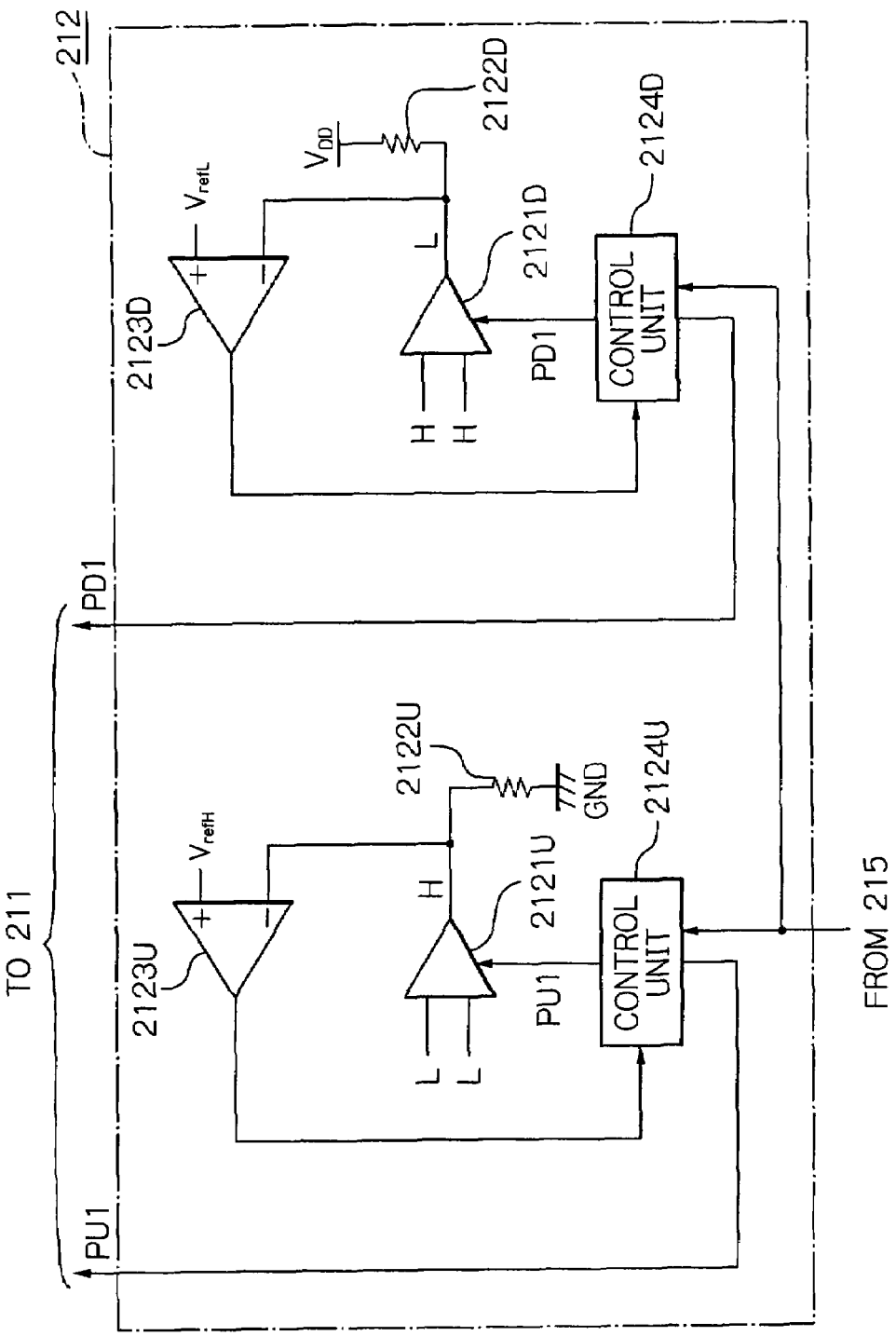
FIG. 6 is a circuit diagram of the output impedance adjusting circuit of the controlling side semiconductor device of FIG. 4.

In FIG. 6, which is a detailed circuit diagram of the output impedance adjusting circuit 212 of FIG. 4, the output impedance adjusting circuit 212 has the same circuit configuration as that of FIG. 3, except that a replica output impedance adjustable output buffer 2121U has two inputs both adapted to receive a low level signal L and a replica output impedance adjustable output buffer 2121D has two inputs both adapted to receive a high level signal H. Note that the elements 2121U thorough 2124U and 2121D through 2124D correspond to the elements 1121U through 1124U and 1121D through 1124D, respectively, of FIG. 3.

The output impedance adjusting operation of the semiconductor apparatus of FIG. 4 is explained next. In this case, note that the determination of the output impedances of the output impedance adjustable differential output buffers 211 and 211' is unnecessary for the determination of the output impedance adjustable differential output buffers 221 and 221'.

First, the control circuit 215 generates data signals D1 and /D1 each formed by two bits. The data signals D1 and /D1 are transmitted to the output impedance adjustable differential output buffer 211 and 211', respectively. In this case, in each of the data signals D1 and /D1, the first bit is a high level and the second bit is a low level. As a result, since the MOS transistors $Q_{p0}$ and $Q_{n0}$, (see: FIG. 6) are both turned OFF, the output impedance adjustable differential output buffers 211 and 211' are both in a high impedance (Hz) state.

Next, the control circuit 215 turns ON the switch 216.

Next, the control circuit 215 generates a data signal D2 whose value is "1". The data signal D2 is transmitted to the output impedance control circuit 214 which, in turn, transmits the data signal D2 via the external connection 242 to the output impedance adjusting circuit 222. Then, the output impedance adjusting circuit 222 transmits the data signal D2 and its inverted signal /D2 to the output impedance adjustable differential output buffer 221 and 221', respectively, which, in turn, generates a high signal H and a low signal L, respectively.

Thus, a current path is established from the power supply terminal $V_{DD}$ through the output impedance adjustable differential output buffer 221, the input/output terminal T221, the transmission line 230, the input/output terminal T211, the node N1, the switch 216, the node N1', the input/output terminal T211', the transmission line 230', the input/output terminal T221' and the output impedance adjustable output buffer 221' to the ground terminal GND. In this case, whatever the resistances of the transmission lines 230 and 230' are, the voltage at the node N1 (N1') is expected to be $V_{DD}/2$.

Next, the output impedance control circuit 214 transmits the output signal of the comparator 213 via the external connection 241 to the output impedance adjusting circuit 222 which adjusts the pull-up adjusting signal PU2 of the output impedance adjustable differential output buffer 221 and the pull-down adjusting signal PD2 of the output impedance adjustable differential output buffer 221', so that the voltage at the node N1 (N1') is made equal to $V_{DD}/2$.

Thus, the pull-up adjusting signal PU2 of the output impedance adjustable differential output buffer 221 and the pull-down adjusting signal PD2 of the output impedance adjustable differential output buffer 221' are determined.

Next, the control circuit 215 generates a data signals D2 whose value is "0". The data signal D2 is transmitted to the output impedance control circuit 214 which, in turn, transmits the data signal D2 via the external connection 242 to the output impedance adjusting circuit 222. Then, the output impedance adjusting circuit 222 transmits the data signal D2 and its inverted signal /D2 to the output impedance adjustable differential output buffer 221 and 221', respectively, which, in turn, generates a low signal L and a high signal H, respectively.

Thus, a current path is established from the power supply terminal $V_{DD}$ through the output impedance adjustable differential output buffer 221', the input/output terminal T221', the transmission line 230', the input/output terminal T211', the node N1', the switch 216, the node N1, the input/output terminal T211, the transmission line 230, the input/output terminal T221 and the output impedance adjustable output buffer 221 to the ground terminal GND. In this case, whatever the resistances of the transmission lines 230 and 230' are, the voltage at the node N1 (N1') is expected to be $V_{DD}/2$.

Next, the output impedance control circuit 214 transmits the output signal of the comparator 213 via the external connection 241 to the output impedance adjusting circuit 222 which adjusts the pull-up adjusting signal PU2 of the output impedance adjustable differential output buffer 221' and the pull-down adjusting signal PD2 of the output impedance adjustable differential output buffer 221, so that the voltage at the node N1 (N1') is made equal to $V_{DD}/2$.

Thus, the pull-up adjusting signal PU2 of the output impedance adjustable differential output buffer 221' and the pull-down adjusting signal PD2 of the output impedance adjustable differential output buffer 221 are determined.

Therefore, the adjustment of the output impedances of the output impedance adjustable differential output buffers 221 and 221' are completed.

In the semiconductor apparatus of FIG. 4, regardless of whether or not series resistors (dumping resistors) are inserted into the transmission lines 230 and 230', the expected voltage at the node N1 (N1') is $V_{DD}/2$, so that the adjustment of the reference voltage $V_{ref}$ is unnecessary.

In the semiconductor apparatus of FIG. 4, however, since the absolute value of the output impedance of each of the output impedance adjustable differential output buffers 221 and 221' cannot be recognized, this absolute value cannot be adjusted. This is fatal when the semiconductor device 220 is a DDR2 SDRAM where an access is carried out by using both rising edges and falling edges of a clock signal.

Also, in the semiconductor apparatus of FIG. 4, in an impedance adjusting operation for the output impedance adjustable differential output buffers 221 and 221', the above-mentioned current path is realized within the output impedance adjustable differential output buffers 221 and 221', so that the adjustment error of the output impedances of the output impedance adjustable differential output buffers 221 and 221' is remarkably large. That is, if the semiconductor device 220 is a DDR2 SDRAM, the source-to-drain voltage $V_{DS}$ of each of the transistors $Q_{P0}$ and $Q_{n0}$ (see: FIG. 5) is 280 mV and the source-to-drain resistance of each of the transistors $Q_{P0}$ and $Q_{n0}$ (see: FIG. 5) is 15 to 20 Ω. Therefore, a current flowing through the above-mentioned current path is very large, i.e., 22 to 45 mA, so that the reduction in voltage by parasitic resistance of signal lines including the transmission lines 230 and 230' is very large. This would invite a large error in the adjusted output impedance.

Figure 7:
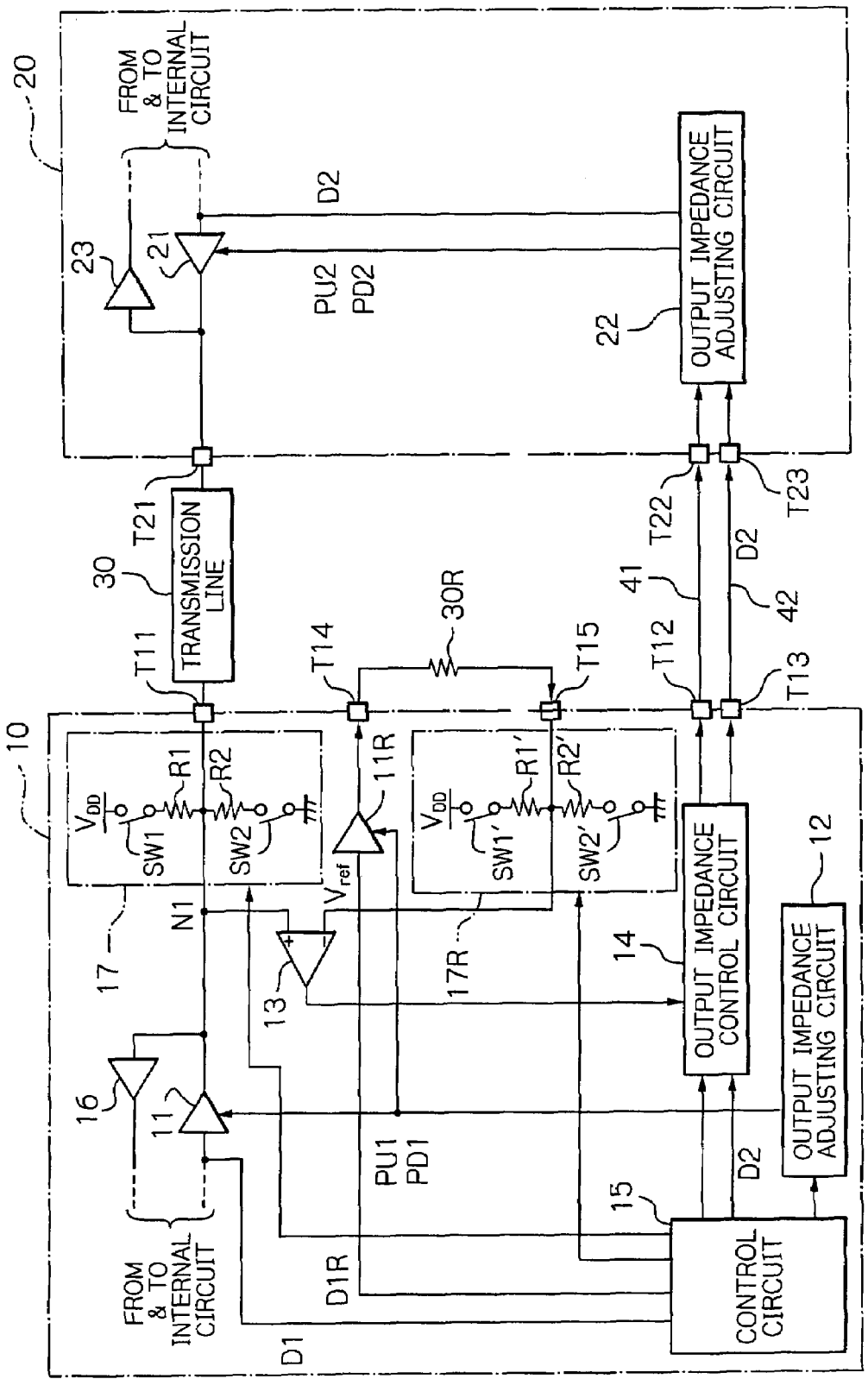
FIG. 7 is a circuit diagram illustrating an embodiment of the semiconductor apparatus according to the present invention.

In FIG. 7, which illustrates an embodiment of the semiconductor apparatus according to the present invention, reference numeral 10 designates a semiconductor device (chip) such as a DMA controller, and 20 designates a semiconductor device (chip) such as a DDR2 or an SDRAM. In this case, the output impedance of the semiconductor device 10 is controlled by the semiconductor device 10 per se, while the output impedance of the semiconductor device 20 is controlled by the semiconductor device 10, not the semiconductor device 20.

The semiconductor device 10 is constructed by an output impedance adjustable output buffer 11 connected to an input/output terminal T11, an output impedance adjusting circuit 12 for adjusting the output impedance of the output impedance adjustable output buffer 11, a comparator 13 for comparing an input voltage at a node N1 connected to the input/output terminal T11 with a reference voltage $V_{ref}$, an output impedance controlling circuit 14 for controlling the output impedance of the semiconductor device 20 in accordance with the output signal of the comparator 13, and a control circuit 15 for controlling the output impedance adjusting circuit 12 and the output impedance controlling circuit 14.

Note that an input buffer 16 is also connected to the node N1. Also, the output impedance controlling circuit 14 is connected to input/output terminals T12 and T13. Further, the output impedance adjustable output buffer 11 and the input buffer 16 are connected to an internal circuit (not shown).

Additionally, a pull-up/pull-down circuit 17 is provided to pull up or pull down the voltage at the input/output terminal T11. The pull-up/pull-down circuit 17 is constructed by a resistor R1 and a switch SW1 connected in series between the input/output terminal T11 and the power supply terminal $V_{DD}$, and a resistor R2 and a switch SW2 connected in series between the input/output terminal T11 and the ground terminal GND. Note that the switches SW1 and SW2 are controlled by the control circuit 15.

A replica load circuit REP is connected to a reference input of the comparator 13. The replica load circuit REP is constructed by a replica output impedance adjustable output buffer 11R of the output impedance adjustable output buffer 11, an external replica highly accurate resistor 30R which corresponds to the characteristic impedance of the transmission line 30 and a replica pull-up/pull-down circuit 17R of the pull-up/pull-down circuit 17. In this case, the external replica highly accurate resistor 30R is connected between input/output terminals T14 and T15. Therefore, when a series resistor (dumping resistor) is inserted into the transmission line 30, the external replica highly accurate resistor 30R can be easily replaced with another replica highly accurate resistor to respond thereto.

The replica pull-up/pull-down circuit 17R has a similar circuit configuration to that of the pull-up/pull-down circuit 17. That is, the replica pull-up/pull-down circuit 17R is constructed by a resistor R1', a switch SW1', a resistor R2' and a switch SW2' corresponding to the resistor R1, the switch SW1, the resistor R2 and the switch SW2, respectively, of the pull-up/pull-down circuit 17. The switch SW1' and SW2' are controlled by the control circuit 15.

Note that a real load circuit REL is connected to a voltage input of the comparator 13. The real load circuit REL is constructed by the output impedance adjustable output buffer 21, the transmission line 30 and the pull-up/pull-down circuit 17.

The real load circuit REL and the replica load circuit REP are also defined as first and second load circuits.

On the other hand, the semiconductor device 20 is constructed by an output impedance adjustable output buffer 21 connected to an input/output terminal T21 and an output impedance adjusting circuit 22 for adjusting the output impedance of the output impedance adjustable output buffer 21.

Note that an input buffer 23 is also connected to the input/output terminal T21. Also, the output impedance adjusting circuit 22 is connected to input/output terminals T22 and T23. Further, the output impedance adjustable output buffer 21 and the input buffer 23 are connected to an internal circuit (not shown).

The input/output terminal T11 of the semiconductor device 10 is connected by a transmission line 30 to the input/output terminal T21 of the semiconductor device 20. Also, the input/output terminals T12 and T13 of the semiconductor device 10 are connected by external connections 41 and 42 to the input/output terminals T22 and T23, respectively, of the semiconductor device 20.

The control circuit 15 operates the output impedance adjusting circuit 12, so that the output impedance adjusting circuit 12 generates a pull-up adjusting signal PU1 formed of m bits and a pull-down adjusting signal PD1 formed of m bits which are supplied to the output impedance adjustable output buffer 11, thus adjusting the output impedance of the output impedance adjustable output buffer 11. That is, the output impedance of the output impedance adjustable output buffer 11 is adjusted by the semiconductor device 10 per se.

Note that the control circuit 15 also generates a data signal D1 which is supplied to the output impedance adjustable output buffer 11, and also generates a data signal D1R which is supplied to the replica output impedance adjustable output buffer 11R. In this case, the output impedance adjustable output buffer 11 and the replica output impedance adjustable output buffer 11R have a similar circuit configuration to that of FIG. 5, so that their outputs can be in a high impedance (Hz) state.

On the other hand, the control circuit 15 operates the output impedance control circuit 14 which, in turn, operates the output impedance adjusting circuit 22, so that the output impedance adjusting circuit 22 generates a pull-up adjusting signal PU2 formed by m bits and a pull-down adjusting signal PD2 formed by m bits which are supplied to the output impedance adjustable output buffer 21, thus adjusting the output impedance of the output impedance adjustable output buffer 21. That is, the output impedance of the output impedance adjustable output buffer 21 is adjusted by the semiconductor device 10, not the semiconductor device 20.

Note that the output impedance adjusting circuit 22 also generates a data signal D2 which is supplied to the output impedance adjustable output buffer 21. In this case, the output impedance adjustable output buffer 21 has a similar circuit to that of FIG. 5, so that its output can be in a high impedance (Hz) state.

The output impedance adjusting operation of the semiconductor apparatus of FIG. 7 is explained next with reference to FIG. 8. This output impedance adjusting operation is carried out by the control circuit 15.

First, referring to step 801, the control circuit 15 operates the output impedance adjusting circuit 12, so that the output impedance of the output impedance adjustable output buffer 11 and the output impedance of the replica output impedance adjustable output buffer 11R are simultaneously adjusted. That is, the control units of the output impedance adjusting circuit 12 similar to those of the control units 1124U and 1124D of FIG. 2 are operated to determine a pull-up adjusting signal PU1 and a pull-down adjusting signal PD1 which are then transmitted to the output impedance adjustable output buffer 11 and the replica output impedance adjustable output buffer 11R.

Next, referring to step 802, the control circuit 15 generates a data signal D1 whose value is a high impedance (Hz) state value. The data signal D1 is transmitted to the output impedance adjustable output buffer 11 which becomes in a high impedance (Hz) state. Also, the control circuit 15 generates a data signal D1R whose value is "1". The data signal D1R is transmitted to the replica output impedance adjustable output buffer 11R which, in turn, generates a high signal H. Further, the control circuit 15 generates a data signal D2 whose value is "1". The data signal D2 is transmitted to the output impedance control circuit 14 which, in turn, transmits the data signal D2 via the external connection 42 to the output impedance adjusting circuit 22. Then, the output impedance adjusting circuit 22 transmits the data signal D2 to the output impedance adjustable output buffer 21 which, in turn, generates a high signal H.

Next, referring to step 803, the control circuit 15 turns OFF the switches SW1 and SW1' and turns ON the switches SW2 and SW2'.

Figure 9A:
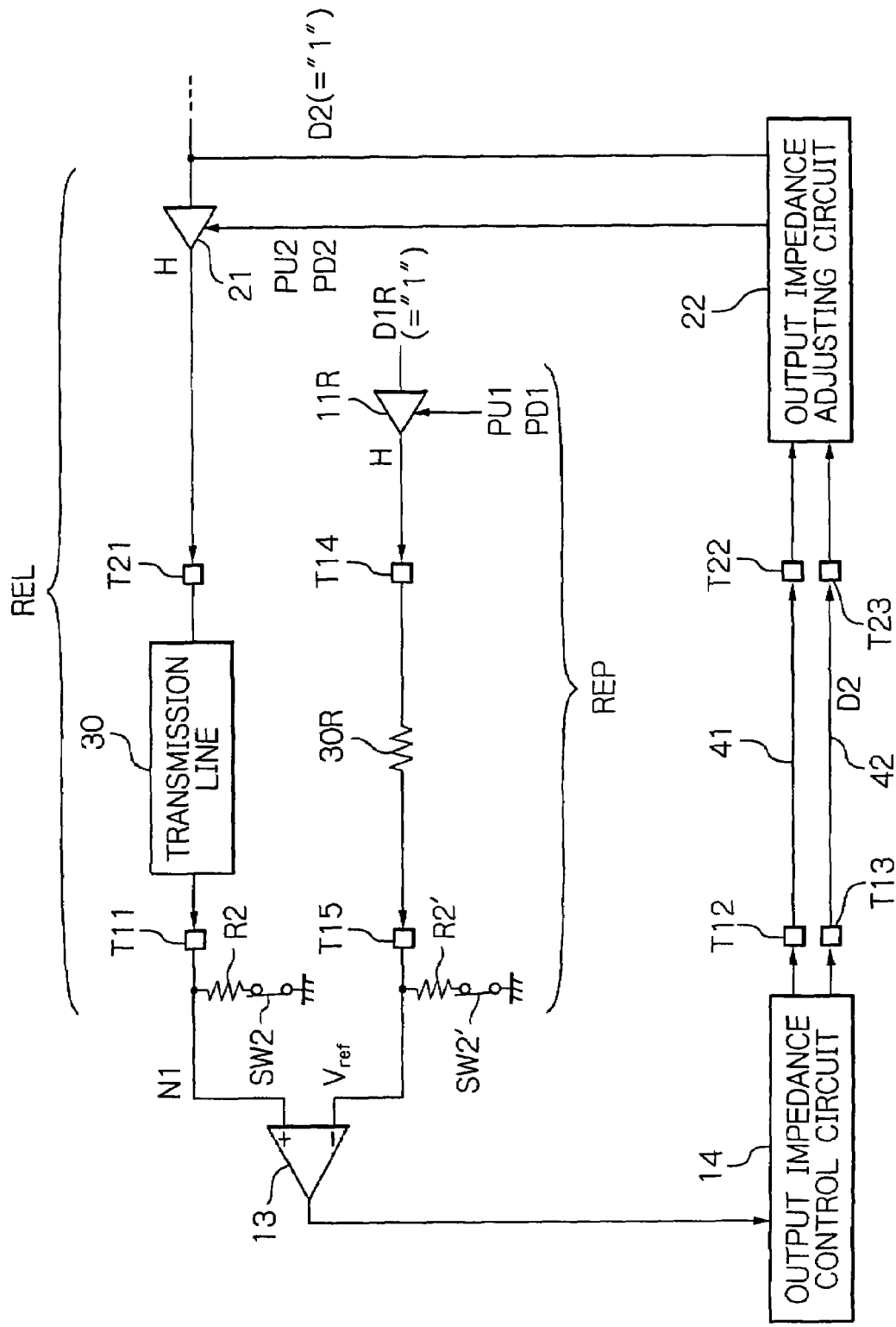
FIG. 9A is a circuit diagram for explaining a step of the flowchart of FIG. 8.

Thus, as illustrated in FIG. 9A, in the real load circuit REL, a current path is established from the power supply terminal $V_{DD}$ through the output impedance adjustable output buffer 21, the input/output terminal T21, the transmission line 30, the input/output terminal T11, the resistor R2 and the ON-state switch SW2 to the ground terminal GND. Also, in the replica load circuit REP, a current path is established from the power supply terminal $V_{DD}$ through the output impedance adjustable output buffer 11R, the input/output terminal T14, the replica highly accurate resistor 30R, the input/output terminal T15, the resistor R2' and the ON-state switch SW2' to the ground terminal GND.

Next, referring to step 804, the control circuit 15 operates the output impedance control circuit 14 which also operates the output impedance adjusting circuit 22. As a result, the output impedance control circuit 14 transmits the output signal of the comparator 13 via the external connection 41 to the output impedance adjusting circuit 22 which adjusts a pull-up adjusting signal PU2 of the output impedance adjustable output buffer 21, so that the voltage at the node N1 is made equal to $V_{ref}$ which is determined by the replica load circuit REP.

Thus, the pull-up adjusting signal PU2 of the output impedance adjustable output buffer 21 is determined.

Next, referring to step 805, the control circuit 15 generates a data signal D1 whose value is a high impedance (Hz) state value. The data signal D1 is transmitted to the output impedance adjustable output buffer 11 which becomes in a high impedance (Hz) state. Also, the control circuit 15 generates a data signal D1R whose value is "0". The data signal D1R is transmitted to the replica output impedance adjustable output buffer 11R which, in turn, generates a low signal L. Further, the control circuit 15 generates a data signal D2 whose value is "0". The data signal D2 is transmitted to the output impedance control circuit 14 which, in turn, transmits the data signal D2 via the external connection 42 to the output impedance adjusting circuit 22. Then, the output impedance adjusting circuit 22 transmits the data signal D2 to the output impedance adjustable output buffer 21 which, in turn, generates a low signal L.

Next, referring to step 806, the control circuit 15 turns ON the switches SW1 and SW1' and turns OFF the switches SW2 and SW2'.

Figure 9B:
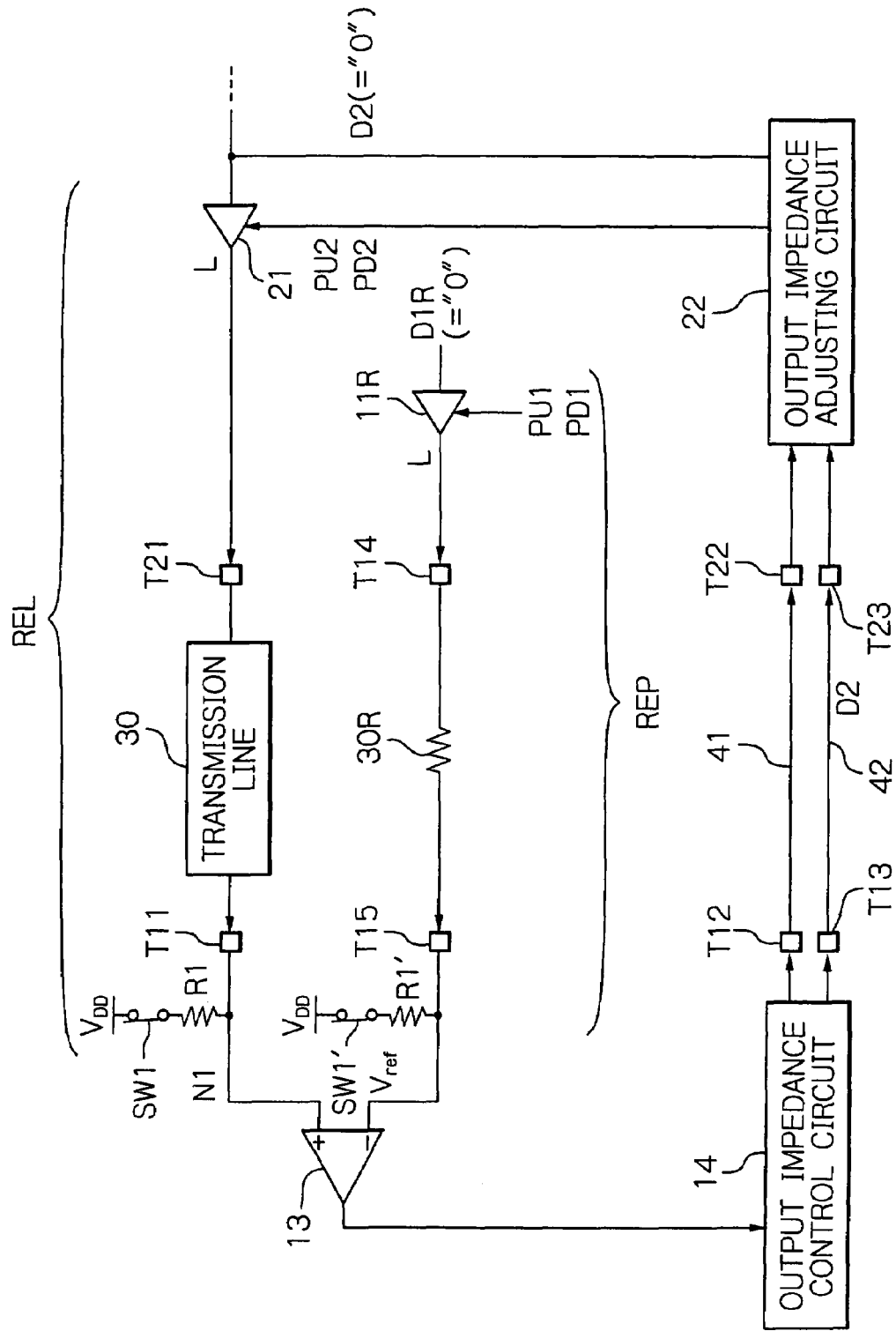
FIG. 9B is a circuit diagram for explaining another step of the flowchart of FIG. 8.

Thus, as illustrated in FIG. 9B, in the real load circuit REL, a current path is established from the power supply terminal $V_{DD}$ through the ON-state switch SW1, the resistor R1, the input/output terminal T11, the transmission line 30, the input/output terminal T21 and the output impedance adjustable output buffer 21 to the ground terminal GND. Also, in the replica load circuit REP, a current path is established from the power supply terminal $V_{DD}$ through the ON-state switch SW1', the resistor R1', the input/output terminal T15, the replica highly accurate resistor 30R, the input/output terminal T14 and the output impedance adjustable output buffer 11R to the ground terminal GND.

Next, referring to step 807, the control circuit 15 operates the output impedance control circuit 14 which also operates the output impedance adjusting circuit 22. As a result, the output impedance control circuit 14 transmits the output signal of the comparator 13 via the external connection 41 to the output impedance adjusting circuit 22 which adjusts a pull-down adjusting signal PD2 of the output impedance adjustable output buffer 21, so that the voltage at the node N1 is made equal to $V_{ref}$ which is determined by the replica load circuit.

Thus, the pull-down adjusting signal PD2 of the output impedance adjustable output buffer 21 is determined.

Then, the routine of FIG. 8 is completed by step 808.

According to the present invention, the replica load circuit REP for simulating the real load circuit REL is provided on the side of the semiconductor device 10, so that the output impedance of the semiconductor device 20 is adjusted by the semiconductor device 10, thus realizing an off-chip driver (OCD) impedance adjusting function. In this case, when a series resistor (dumping resistor) is inserted into the transmission line 30 of the real load circuit REL, since the replica highly accurate resistor 30R is provided externally to the semiconductor device 10, this replica highly accurate resistor 30R is easily replaced with another replica highly accurate resistor. As a result, regardless of whether or not a series resistor (dumping resistor) is inserted into the transmission line 30, the replica load circuit REP can optimally simulate the real load circuit REL.

Also, in the semiconductor apparatus of FIG. 7, the absolute value of the adjusted output impedance of the output impedance adjustable output buffer 11 can be recognized.

Further, in the semiconductor apparatus of FIG. 7, in an impedance adjusting operation for the output impedance adjustable output buffer 21, the above-mentioned current path in the real load circuit REL or the replica load circuit REP is realized within the output impedance adjustable output buffer 21 or 11R, however, the adjustment error of the output impedance of the output impedance adjustable output buffer 21 is relatively small. That is, the resistance value of the resistors R1, R2, R1' and R2' of the pull-up/pull-down circuits 17 and 17R is much larger than the source-to-drain resistance such as 15 to 20 Ω of each of the transistors $Q_{p0}$ and $Q_{n0}$ (see: FIG. 5). For example, the resistance value of the resistors R1, R2, R1' and R2' is 300 Ω. Therefore, a current flowing through the above-mentioned current path is very small, i.e., about 0.5 mA, so that the reduction in voltage by a parasitic resistance of signal lines including the transmission line 30 and the replica highly accurate resistor 30R is very small. This would not invite an error in the adjusted output impedance.

Figure 10:
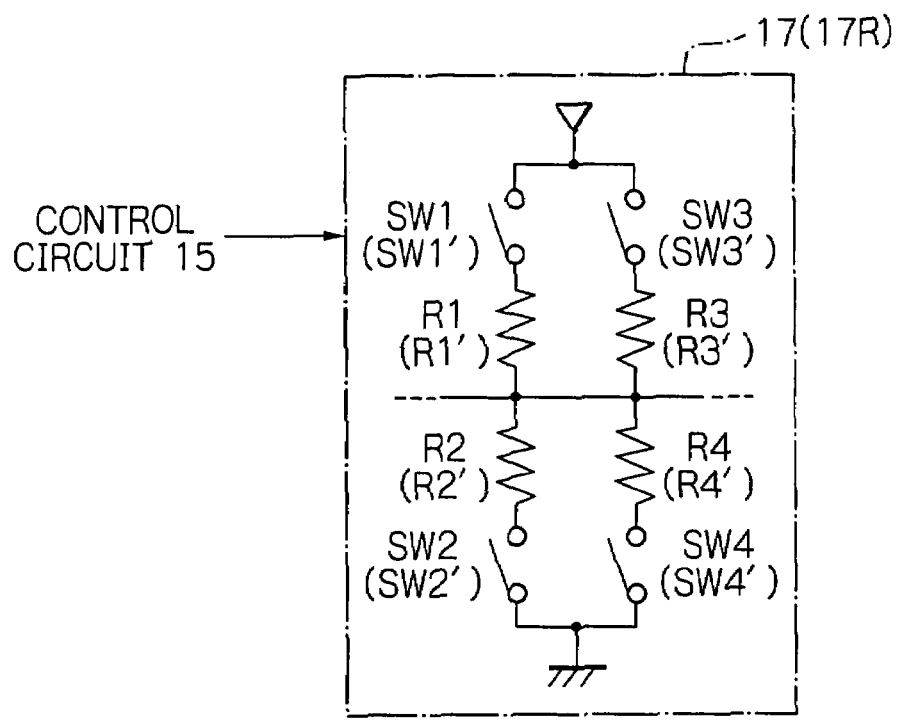
FIG. 10 is a circuit diagram illustrating a modification of the pull-up/pull-down circuit of FIG. 7.

In FIG. 10, which illustrates a modification of the pull-up/pull-down circuit 17 (the replica pull-up/pull-down circuit 17R) of FIG. 7, a series of a resistor R3 (R3') and a switch SW3 (SW3') are connected in parallel with the series of the resistor R1 (R1') and a switch SW1 (SW1'), and a series of a resistor R4 (R4') and a switch SW4 (SW4') are connected in parallel with the series of the resistor R2 (R2') and a switch SW2 (SW2'). As a result, a pull-up resistance or a pull-down resistance can have three values. For example, if R1 (R1', R2, R2')=100 Ω and R3 (R3', R4, R4')=150 Ω, the pull-up resistance or the pull-down resistance can be 100 Ω, 150 Ω and 300 Ω. This would optimally respond to the parasitic resistance of signal lines including the transmission line 30 and the replica highly accurate resistor 30R.

Figure 11:
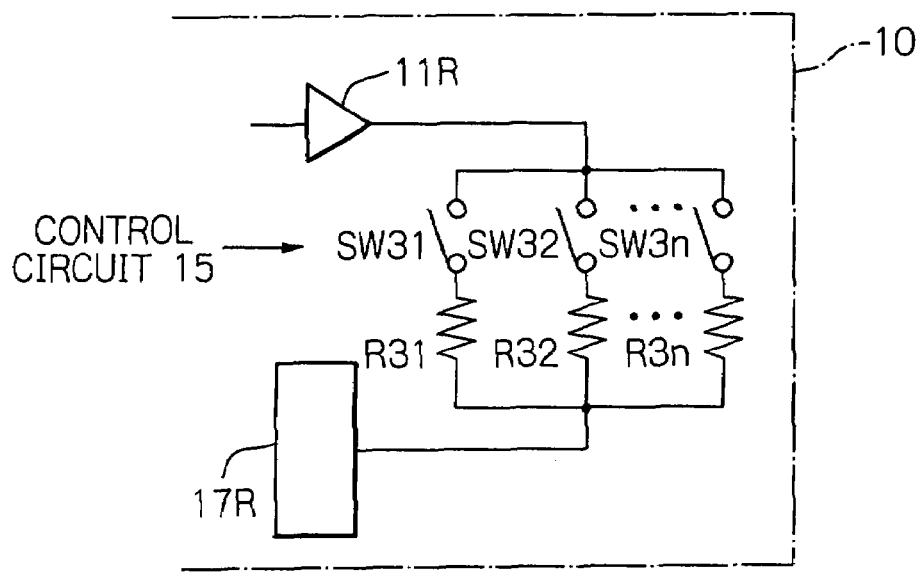
FIG. 11 is a circuit diagram illustrating a modification of the replica highly accurate resistor of FIG. 7.

In FIG. 11, which illustrates a modification of the external replica highly accurate resistor 30R of FIG. 7, the external replica highly accurate resistor 30R is replaced by a plurality of internal replica resistor R31, R32, . . . , R3n whose resistance values are different from each other, and a plurality of internal switches SW31, SW32, . . . , SW3n each connected in series to one of the internal replica resistors R31, R32, . . . , R3n. The control circuit 15 turns ON and OFF the internal switches SW31, SW32, . . . , SW3n in accordance with the resistance value of a series resistor (dumping resistor) inserted into the transmission line 30, that is, one or more of the internal replica resistors R31, R32, . . . , R3n.

In the above-described embodiment, each of the output impedance adjustable output buffers 11, 11R and 21 can be output impedance adjustable differential output buffers. Also, only one output impedance adjustable output buffer is provided in each of the semiconductor devices 10 and 20; however, the present invention can be applied to a semiconductor apparatus where each semiconductor device (chip) has a plurality of output impedance adjustable output buffers.

The invention claimed is:

1. A semiconductor device capable of adjusting an output impedance of a first output impedance adjustable output buffer of an external semiconductor device connectable to said semiconductor device, comprising:
a second output impedance adjustable output buffer;
a comparator adapted to compare a first output voltage of a first load circuit including said first output impedance adjustable output buffer with a second output voltage of a second load circuit including said second output impedance adjustable output buffer; and an output impedance control circuit adapted to transmit an output signal of said comparator to said external semiconductor device to adjust the output impedance of said first output impedance adjustable output buffer, depending on the second output voltage, so that said first output voltage is made equal to said second output voltage.

2. The semiconductor device as set forth in claim 1, further comprising:
a first pull-up/pull-down circuit included in said first load circuit; and
a second pull-up/pull-down circuit included in said second load circuit.

3. The semiconductor device as set forth in claim 2, wherein said second pull-up/pull-down circuit is a replica of said first pull-up/pull-down circuit.

4. The semiconductor device as set forth in claim 2, wherein each of said first and second pull-up/pull-down circuits comprises a pull-up resistor associated with a pull-up switch and a pull-down resistor associated with a pull-down switch, resistance values of said pull-up resistor and said pull-down resistor being larger than those of said first and second output impedance adjustable output buffers.

5. The semiconductor device as set forth in claim 2, wherein said first load circuit comprises an external transmission line connected between said first output impedance adjustable output buffer and said first pull-up/pull-down circuit, and
wherein said second load circuit comprises an external replica resistor connected between said second output impedance adjustable output buffer and said second pull-up/pull-down circuit, a resistance value of said external replica resistor corresponding to a characteristic impedance of said external transmission line.

6. The semiconductor device as set forth in claim 5, further comprising:
a first terminal connected to said second output impedance adjustable output buffer; and
a second terminal connected to said second pull-up/pull-down circuit, said external replica resistor being connected between said first and second terminals.

7. The semiconductor device as set forth in claim 2, wherein said first load circuit comprises an external transmission line connected between said first output impedance adjustable output buffer and said first pull-up/pull-down circuit, and
wherein said second load circuit comprises a plurality of internal replica resistors associated with internal switches connected between said second output impedance adjustable output buffer and said second pull-up/pull-down circuit, a resistance value of at least one of said internal replica resistors selected by said internal switches corresponding to a characteristic impedance of said external transmission line.

8. The semiconductor device as set forth in claim 1, further comprising a third output impedance adjustable output buffer connected to an internal circuit and included in said first load circuit,
said second output impedance adjustable output buffer being a replica of said third output impedance adjustable output buffer.

9. A method of semiconductor device capable of adjusting an output impedance of a first output impedance adjustable output buffer of an external semiconductor device connectable to a semiconductor device including a second output impedance adjustable output buffer, comprising:
comparing a first output voltage of a first load circuit including said first output impedance adjustable output buffer with a second output voltage of a second load circuit including said second output impedance adjustable output buffer, to generate a comparison signal; and
transmitting said comparison signal to said external semiconductor device to adjust the output impedance of said first output impedance adjustable output buffer,depending on the second output voltage, so that said first output voltage is made equal to said second output voltage.

10. The method as set forth in claim 9, further comprising:
supplying a first current between said first output impedance adjustable output buffer and a first pull-up/pull-down circuit to obtain said first output voltage; and
supplying a second current between said second output impedance adjustable output buffer and a second pull-up/pull-down circuit to obtain said second output voltage.

11. The method as set forth in claim 10, wherein each of said first and second pull-up/pull-down circuits comprises a pull-up resistor associated with a pull-up switch and a pull-down resistor associated with a pull-down switch, resistance values of said pull-up resistor and said pull-down resistor being larger than those of said first and second output impedance adjustable output buffers.

12. The method as set forth in claim 10, wherein said first load circuit comprises an external transmission line connected between said first output impedance adjustable output buffer and said first pull-up/pull-down circuit, and
wherein said second load circuit comprises an external replica resistor connected between said second output impedance adjustable output buffer and said second pull-up/pull-down circuit, a resistance value of said external replica resistor corresponding to a characteristic impedance of said external transmission line.

13. The method as set forth in claim 12, wherein said semiconductor device comprises:
a first terminal connected to said second output impedance adjustable output buffer; and
a second terminal connected to said second pull-up/pull-down circuit,
said external replica resistor being connected between said first and second terminals.

14. The semiconductor device as set forth in claim 10, wherein said first load circuit comprises an external transmission line connected between said first output impedance adjustable output buffer and said first pull-up/pull-down circuit, and
wherein said second load circuit comprises a plurality of internal replica resistors associated with internal switches connected between said second output impedance adjustable output buffer and said second pull-up/pull-down circuit, a resistance value of at least one of said internal replica resistors selected by said internal switches corresponding to a characteristic impedance of said external transmission line.

15. The semiconductor device as set forth in claim 9, wherein said semiconductor device comprises a third output impedance adjustable output buffer connected to an internal circuit and included in said first load circuit,
said second output impedance adjustable output buffer being a replica of said third output impedance adjustable output buffer.

16. The method as set forth in claim 15, further comprising:
adjusting output impedances of said second and third output impedance adjustable output buffers simultaneously before said first output voltage is compared with said second output voltage; and making said third output impedance adjustable output buffer in a high impedance state when said first output voltage is compared with said second output voltage.

* * * * *